United States Patent
Jiang (10) Patent No.: US 12,463,083 B2
(45) Date of Patent: Nov. 4, 2025

(54) WAFER LOCKING MECHANISM, WAFER POSITIONING DEVICE AND WAFER CONVEYING APPARATUS

(71) Applicant: ZHONGKE JINGYUAN ELECTRON LIMITED, BEIJING (CN), Beijing (CN)

(72) Inventor: Lei Jiang, Beijing (CN)

(73) Assignee: ZHONGKE JINGYUAN ELECTRON LIMITED, BEIJING (CN), Beijing (CN)

( * ) Notice: Subject to any disclaimer, the term of this patent is extended or adjusted under 35 U.S.C. 154(b) by 423 days.

(21) Appl. No.: 18/009,773

(22) PCT Filed: May 28, 2021

(86) PCT No.: PCT/CN2021/096750
§ 371 (c)(1),
(2) Date: Dec. 12, 2022

(87) PCT Pub. No.: WO2022/142114
PCT Pub. Date: Jul. 7, 2022

(65) Prior Publication Data
US 2023/0223293 A1    Jul. 13, 2023

(30) Foreign Application Priority Data
Dec. 30, 2020    (CN) .......................... 202011621733.9

(51) Int. Cl.
*H01L 21/687*    (2006.01)
*H01L 21/677*    (2006.01)
(Continued)

(52) U.S. Cl.
CPC .. *H01L 21/68728* (2013.01); *H01L 21/67754* (2013.01); *H01L 21/681* (2013.01); *H01L 21/6831* (2013.01)

(58) Field of Classification Search
CPC ................................................ H01L 21/68728
See application file for complete search history.

(56) References Cited

U.S. PATENT DOCUMENTS 6,578,853 B1 *   6/2003   Treur ................ H01L 21/68728
                                                                     279/108
6,827,092 B1 *  12/2004   Smith ............... H01L 21/68785
                                                                      134/32
(Continued)

FOREIGN PATENT DOCUMENTS

| CN | 103594406 | 2/2014 |
| CN | 104570493 | 4/2015 |

(Continued)

OTHER PUBLICATIONS

International Search Report and Written Opinion in International Appln. No. PCT/CN2021/096750, mailed on Aug. 25, 2021, 5 pages.

*Primary Examiner* — Daniel D Yabut
(74) *Attorney, Agent, or Firm* — troutman pepper locke; Tim Tingkang Xia, Esq.

(57) ABSTRACT

Provided is a wafer locking mechanism configured to lock a wafer, the wafer locking mechanism comprising: a wafer base, constructed in a form of a frustum shape tapering from a bottom portion thereof towards a top portion thereof, and configured to be elevatable along a direction of an axis thereof; a plurality of rods, which are diametrically aligned in pairs perpendicular to the axis; and a plurality of compression springs, which are respectively sheathed on respective distal ends of the plurality of rods distal to the wafer base, in one-to-one correspondence and extend radially outwards. Each of the rods is provided with a ball-head portion which is located at a proximal end thereof proximate (Continued)

to the wafer base and abuts against the wafer base, and a jaw which is pressed radially inwards by the corresponding compression spring.

23 Claims, 9 Drawing Sheets

(51) Int. Cl.
    *H01L 21/68*     (2006.01)
    *H01L 21/683*     (2006.01)

(56) References Cited

U.S. PATENT DOCUMENTS

| | | | |
|---|---|---|---|
| 10,811,299 B2 * | 10/2020 | LaBrie | H01L 21/68 |
| 2002/0153676 A1 * | 10/2002 | Noguchi | H01L 21/67288 |
| | | | 118/503 |
| 2010/0196127 A1 * | 8/2010 | Zama | G01N 21/9501 |
| | | | 414/331.02 |
| 2014/0322919 A1 * | 10/2014 | Stafford | H01L 21/68792 |
| | | | 438/758 |
| 2015/0243542 A1 * | 8/2015 | Yoshihara | H01L 21/68728 |
| | | | 156/345.23 |
| 2015/0296564 A1 | 10/2015 | Lin et al. | |
| 2019/0252214 A1 * | 8/2019 | Okita | H01L 21/68728 |
| 2019/0341290 A1 * | 11/2019 | LaBrie | H01L 21/6838 |
| 2022/0044959 A1 * | 2/2022 | Hong | H01L 21/67023 |

FOREIGN PATENT DOCUMENTS

| | | | | |
|---|---|---|---|---|
| CN | 112736014 | | 4/2021 | |
| KR | 2001054424 A | * | 7/2001 | ....... H01L 21/68728 |
| KR | 20130090213 A | * | 8/2013 | |
| WO | WO-0201597 A1 | * | 1/2002 | ............. B82Y 10/00 |
| WO | WO-0237527 A1 | * | 5/2002 | ............. B82Y 10/00 |

* cited by examiner

WAFER LOCKING MECHANISM, WAFER POSITIONING DEVICE AND WAFER CONVEYING APPARATUS

CROSS-REFERENCE TO RELATED APPLICATIONS

This application is a U.S. national phase filing under 35 U.S.C. § 371 of International Application No. PCT/CN2021/096750 filed on May 28, 2021, entitled "WAFER LOCKING MECHANISM FOR LOCKING WAFER, WAFER POSITIONING DEVICE AND WAFER CONVEYING APPARATUS", which claims priority to the priority of Chinese Patent Application Invention No. 202011621733.9 filed on Dec. 30, 2020 in the China National Intellectual Property Administration, the whole disclosure of which is incorporated herein by reference.

BACKGROUND

Field

Embodiments of the present disclosure generally relate to the technical field of semiconductor technology, and more particularly to a wafer locking mechanism for locking wafer, a wafer positioning device, a wafer conveying apparatus, a vacuum chamber device for transferring a wafer between different pressure environments, and an electron beam detection apparatus.

Description of Relevant Art

In recent years, in semiconductor industry, electron beam detection devices, such as scanning electron microscopy and the like, are typically utilized to detect wafer defects.

Due to kinematic precision, control precision and machining precision of the robot arm itself which is used to transfer wafer, and the like, above all, in usage of an electron beam detection apparatus, an position error may accumulate gradually in a process of transferring the wafer, which may sometimes result in that the wafer cannot be accurately placed on or removed from a wafer stage, or even lead to an interruption in an automatic detection process implemented by the electron beam detection apparatus. Secondly, the smaller a field of view of an optical microscope used for aiming purpose is, the higher a yield and a throughput of the apparatus may be; however, the smaller the field of view is, the higher a positioning precision of the wafer is required. Therefore, it is urgently desired to improve a convenience degree in both locking of the wafer before the wafer is adsorbed to the stage and unlocking from the stage after detection, and to improve the positioning precision of the wafer on the wafer stage.

SUMMARY

The embodiments of the present disclosure have been made to overcome or alleviate at least one aspect of the aforementioned disadvantages and/or shortcomings in the prior art, by providing a wafer locking mechanism for locking wafer, a wafer positioning device, a wafer conveying apparatus, a vacuum chamber device for transferring a wafer between different pressure environments, and an electron beam detection apparatus.

In order to achieve above objectives, following technical solutions are adopted in exemplary embodiments of the invention.

According to one aspect of the present disclosure, there is provided a wafer locking mechanism configured to lock a wafer, the wafer locking mechanism comprising: a wafer base, constructed in a form of a frustum shape tapering from a bottom portion thereof towards a top portion thereof, and configured to be elevatable along a direction of an axis thereof; a plurality of rods, which are diametrically aligned in pairs perpendicular to the axis; and a plurality of compression springs, which are respectively sheathed on respective distal ends of the plurality of rods distal to the wafer base, in one-to-one correspondence and extend radially outwards. The plurality of rods are respectively provided with both a plurality of ball-head portions which are located at respective proximal ends thereof proximate to the wafer base and abut against the wafer base, in one-to-one correspondence, and a plurality of jaws which protrude from the respective distal ends along a direction of the axis on a single side of the top portion and are pressed radially inwards by the plurality of compression springs, in one-to-one correspondence.

According to embodiments of the present disclosure, one rod in each pair of rods in the plurality of rods is provided with an adjusting threaded member, which is located at a respective distal end of the one rod and is screwable to push radially against a respective one of the plurality of compression springs.

According to embodiments of the present disclosure, each adjusting screw member is in a form of an adjusting screw.

According to embodiments of the present disclosure, the other rod of each pair of rods in the plurality of rods is provided with a locking threaded member, which is located at a respective distal end of the other rod and is screwable to be locked.

According to embodiments of the present disclosure, each locking threaded member is in a form of a locking screw-stud.

According to embodiments of the present disclosure, the plurality of rods comprises an even number of pairs of rods.

According to embodiments of the present disclosure, the even number of pairs of rods comprises two pairs of rods arranged at uniform angular interval in a circumferential direction perpendicular to the axis.

According to embodiments of the present disclosure, the wafer base is shaped to have a contour which is a truncated cone on an upper portion thereof and a cylindrical shape on a lower portion thereof, with an intermediate portion smoothly transiting in shape being formed therebetween.

According to embodiments of the present disclosure, the wafer base is shaped to have a longitudinal section whose contour at side surface of the wafer base is a curve along which the plurality of rods conduct respective expected motions, as a function of an elevating or descending movement of the wafer base.

According to embodiments of the present disclosure, the plurality of rods are formed with respective holes extending in the direction of the axis, and the plurality of jaws at least partially pass through and are fixed in respective one of the holes of the respective rods in the plurality of rods, in one-to-one correspondence.

According to embodiments of the present disclosure, the wafer locking mechanism further comprises a rod base formed with an axial channel through which the wafer base is elevatable and a plurality of radial channels through which the plurality of rods are extendable.

In addition, according to another aspect of the present disclosure, there is provided a wafer positioning device, comprising: the wafer locking mechanism as above, a wafer support, and an electrostatic chuck. The wafer support comprises: a base plate which is vertically movable, with a base portion of the wafer base being fixed thereto; and a plurality of pillars extending from the base plate in the same direction as a direction in which the plurality of jaws extend. The electrostatic chuck is mounted above the wafer base and circumscribed among the plurality of jaws, and is configured to hold the wafer by electrostatic adsorption applied thereby.

According to embodiments of the present disclosure, the base plate is in a form of a triangle shape, and the plurality of pillars comprise three pillars located at three vertices of the triangle shape, respectively.

According to embodiments of the present disclosure, each of the plurality of pillars has a respective free end formed by hard rubber.

According to embodiments of the present disclosure, the wafer positioning device further comprises an ionic wind supply. Each of the plurality of pillars is further provided with: a support portion which is provided at a free end thereof and is to be in contact with the wafer to be detected, by means of an upper surface of the support portion when the wafer positioning device carries the wafer; a channel which is provided therethrough and configured to deliver an ionic wind outputted from the ionic wind supply into the respective one of the plurality of pillars; and a plurality of first vent holes which are located on the upper surface of the support portion and are in communication with the channel, with the ionic wind being delivered therethrough and in turn blown towards the wafer.

According to embodiments of the present disclosure, the support portion is constructed to be a hollow structure defined collectively by both the upper surface and a sidewall of the support portion, and the sidewall is additionally provided with a plurality of second vent holes in communication with the channel.

According to embodiments of the present disclosure, each of the plurality of pillars is further provided with a flow-guiding shield which is disposed around a periphery of the support portion with a gap between the flow-guiding shield and the support portion.

According to embodiments of the present disclosure, each of the plurality of pillars is further provided with an auxiliary support portion which is additionally provided on the support portion and comprises a dome cover provided on the upper surface of the support portion and a floating ball provided within the dome cover, and the dome cover is further provided at a top end thereof with an opening, a diameter of which is smaller than that of the floating ball.

According to embodiments of the present disclosure, the ionic wind supply comprises: an ion source in communication with the channel of each of the plurality of pillars; and a ventilation device provided at an entrance of the channel of each of the plurality of pillars.

According to embodiments of the present disclosure, the ion source is provided adjacent to the free end, within the channel of each of the plurality of pillars, and wherein the ion source is a metallic discharge needle.

According to embodiments of the present disclosure, the bottom plate is driven to elevate or descend by a motor, or a piezoelectric driving device formed by piezoelectric material.

In addition, according to another aspect of the present disclosure, there is provided a wafer conveying apparatus comprises: the wafer positioning device as above; a two-dimensional workbench, which carries the wafer positioning device and is configured to perform a planar two-dimensional movement to move the wafer positioning device to a wafer exchange position where the wafer is to be loaded or removed; and a robot arm, which is arranged alongside the wafer positioning device and configured to move the wafer to a position above and concentric with the electrostatic chuck.

In addition, according to another aspect of the present disclosure, there is provided a vacuum chamber device configured to transfer a wafer between different pressure environments, comprising: a housing, which defines a vacuum chamber therein as a first pressure environment; the wafer conveying device as above, which is provided inside the vacuum chamber; and a valve, which is provided on a side of the housing and is configured to switch between a communication state where the vacuum chamber and a second pressure environment different from the first pressure environment are in communication with each other once the valve is opened therebetween, and a disconnected state where the vacuum chamber and the second pressure environment are disconnected with each other once the valve is closed therebetween, such that the second pressure environment is at substantially the same pressure as the vacuum chamber in response to the communication state, or the vacuum chamber maintains its predefined vacuum condition in response to the disconnected state. The robot arm is configured to transfer the wafer between the second pressure environment and the vacuum chamber.

In addition, according to another aspect of the present disclosure, there is provided an electron beam detection apparatus, comprising: a first housing, which defines a vacuum chamber therein, with both an electron beam detection device and the wafer conveying device as above being mounted in the vacuum chamber, and the electron beam detection device comprising a scanning electron microscope; a second housing, which is provided adjacent to the first housing and defines a transition chamber therein, the transition chamber communicating at one side thereof with the vacuum chamber via a first valve and communicating at the other side thereof with an atmosphere environment via a second valve. The robot arm is configured to move the wafer from the transition chamber into the vacuum chamber; and the electron beam detection apparatus further comprises a second robot arm which is provided outside the first housing and configured to move the wafer from the atmospheric environment into the transition chamber.

BRIEF DESCRIPTION OF THE DRAWINGS

Embodiments of the present disclosure will now be described, merely by way of example, with reference to the accompanying schematic drawings, in which the corresponding reference numerals represent the corresponding components. A brief description of the drawings is as follows.

DETAILED DESCRIPTION OF EMBODIMENTS

Technical solution of the present disclosure will be further explained in detail through the embodiments in combination with the accompanying drawings. In the specification, same or similar reference numerals and alphabets indicate same or similar components. Following description of the embodiments of the present disclosure with reference to the accompanying drawings is intended to explain overall inventive concept of the present disclosure, rather than a limitation of the present disclosure.

The accompanying drawings are used to illustrate the contents of embodiments of the present disclosure. Dimensions and shapes of the components in the drawings do not demonstrate true scales of components of a wafer locking mechanism for locking wafer, wafer positioning device and wafer conveying apparatus.

Above all, an operation principle on which the present disclosure is based, is described.

Figure 1:
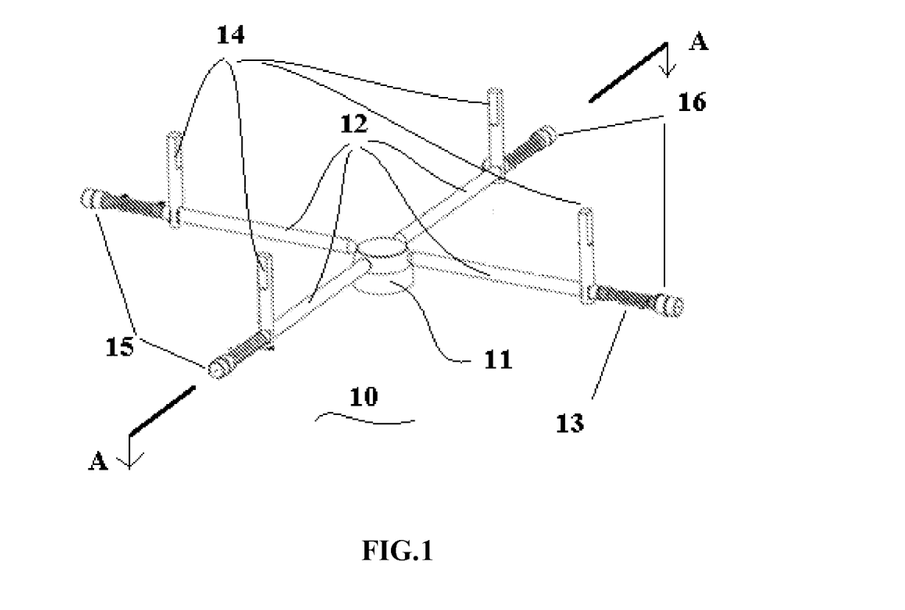
FIG. 1 shows a structural schematic view of a wafer locking mechanism configured to lock a wafer, according to embodiments of the present disclosure.
Figure 2:
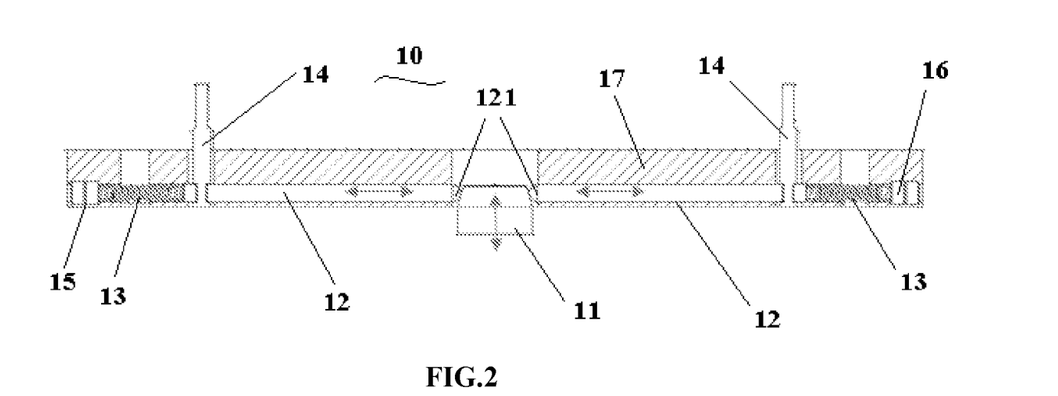
FIG. 2 shows a sectional view of the wafer locking mechanism taken along a A-A line as shown in FIG. 1.

FIG. 1 shows a structural schematic view of a wafer locking mechanism configured to lock a wafer, according to embodiments of the present disclosure; and FIG. 2 shows a sectional view of the wafer locking mechanism taken along a A-A line as shown in FIG. 1.

Thereby, according to an overall technical concept of embodiments of the present disclosure, as shown in FIG. 1 and FIG. 2, in one aspect of embodiments of the present disclosure, a wafer locking mechanism 10 configured to lock a wafer is proposed, comprising: a wafer base 11, constructed in a form of a frustum shape tapering from a bottom portion thereof towards a top portion thereof, and configured to be elevatable along a direction of an axis thereof; a plurality of rods 12, which are diametrically aligned (i.e., aligned in a diametrical direction perpendicular to the axis) in pairs perpendicular to the axis; and a plurality of compression springs 13, which are respectively sheathed on respective distal ends of the plurality of rods 12 distal to the wafer base 11, in one-to-one correspondence and extend radially outwards. Furthermore, the plurality of rods 12 are respectively provided with both a plurality of ball-head portions 121 which are located at respective proximal ends thereof proximate to the wafer base 11 and abut against the wafer base 11, in one-to-one correspondence, and a plurality of jaws 14 which protrude from the respective distal ends along a direction of the axis on a single side of the top portion and are pressed radially inwards by the plurality of compression springs 13, in one-to-one correspondence.

In an embodiment of the present disclosure, typically, by way of example, the wafer base is shaped to have a contour which is a truncated cone on an upper portion thereof and a cylindrical shape on a lower portion thereof, with an intermediate portion smoothly transiting in shape being formed therebetween.

In an embodiment of the present disclosure, the plurality of rods 12 comprises an even number of pairs of rods 12. By way of example, the even number of pairs of rods 12 comprises two pairs of rods 12 arranged at a uniform angular interval in a circumferential direction perpendicular to the axis. Such an arrangement substantially minimizes both specific number of rods 12 and specific number of jaws 14, as desired for locking wafer, and an uniform distribution of either the rods or the jaws in a circumferential direction may result in an uniform distribution of stress acting on a periphery of the wafer when the wafer is being locked by the wafer locking mechanism.

In an embodiment of the present disclosure, by way of example, the plurality of jaws 14 are fixed to respective rods of the plurality of rods 12, in one-to-one correspondence, more specifically for example, the plurality of jaws 14 at least partially pass through and are fixed in respective one of holes, which are formed to extend in the direction of the axis through the plurality of rods, in the respective rods in the plurality of rods, in one-to-one correspondence. With such an arrangement, the plurality of jaws 14 may be fixedly integrated with the plurality of rods 12.

Figure 3A:
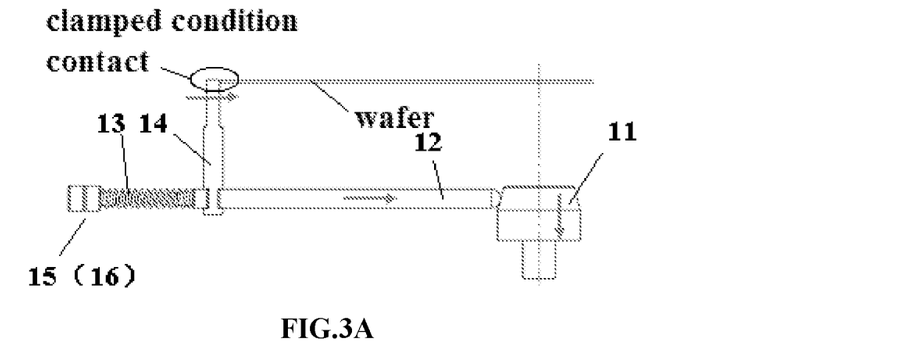
FIG. 3A shows a schematic view of the wafer locking mechanism in a clamping condition.
Figure 3B:
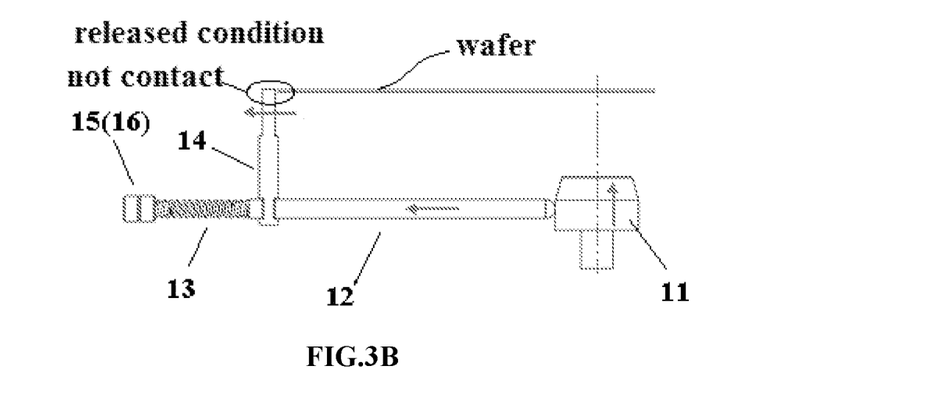
FIG. 3B shows a schematic view of the wafer locking mechanism in a releasing condition.

FIG. 3A shows a schematic view of the wafer locking mechanism in a clamping condition, and FIG. 3B shows a schematic view of the wafer locking mechanism in a releasing condition.

A detailed operation principle of the wafer locking mechanism 10 of embodiments of the disclosure is illustrated, on the basis of an exemplary structure of the wafer locking mechanism as illustrated in FIG. 1 and FIG. 2, in view of schematic views of two different working conditions as illustrated respectively in FIG. 3A and FIG. 3B.

Above all, as illustrated in FIG. 1 and FIG. 2, the plurality of rods 12 are pushed radially inwards under an action of elastic force as applied by the plurality of compression springs 13 located on respective distal ends of the plurality of rods 12, such that respective ball-head portions 121 of the plurality of rods 12 abut against and contact side surface of the wafer base 11 in the form of a frustum shape. Next, the wafer to be detected is moved to be located above the wafer locking mechanism 10, for example, approximately within a range as defined by the jaws 14 which have not yet been retracted radially inwards.

Furthermore, a switching of the wafer locking mechanism 10 between above two different working conditions as illustrated in FIG. 3A and FIG. 3B once the wafer base 11 is elevated or is lowered, is taken into consideration.

On one hand, as illustrated in FIG. 3A in view of FIG. 1 and FIG. 2, in a condition that the wafer base 11 is lowered in the direction of the axis, then cross section of the wafer base 11 at different moments in a plane where the plurality of rods 12 are located (e.g., a plane where respective central axes of the plurality of rods 12 are located collectively) may gradually decrease over time, and for example may be implemented such that a diameter of the cross section at different moments in the plane where the plurality of rods 12 are located may also gradually decrease over time, and the plurality of rods 12 may keep their respective ball-head portions 121 in contact with the surface of the wafer base 11, under a pushing action of the elastic force as applied by respective compression springs 13, thereby the plurality of rods 12 are moved radially inwards; in other words, the plurality of rods 12 are moved in respective directions directing towards a center of the wafer to be clamped, and bring the plurality of jaws 14 to retract radially inwards, thus four jaws 14 which are arranged in two pairs as illustrated may retract radially simultaneously so as to clamp the wafer in position, such that the wafer is in a clamped condition.

On the other hand, as illustrated in FIG. 3B in view of FIG. 1 and FIG. 2, in a condition that the wafer base 11 is elevated in the direction of the axis, then cross section of the wafer base 11 at different moments in the plane where the plurality of rods 12 are located (e.g., the plane where respective central axes of the plurality of rods 12 are located collectively) may gradually increase over time, and for example may be implemented such that the diameter of the cross section at different moments in the plane where the plurality of rods 12 are located may also gradually increase over time, and the plurality of rods may keep their respective ball-head portions 121 in contact with the surface of the wafer base 11, under a pushing action of the elastic force as applied by respective compression springs 13, thereby the plurality of rods are moved radially outwards; in other words, the plurality of rods 12 are moved in respective directions directing away from the center of the wafer to be clamped, i.e., moved in respective directions opposite to moving directions of the plurality of rods 12 as illustrated in FIG. 3A, and bring the plurality of jaws to deploy/expand radially outwards, thus four jaws 14 which are arranged in two pairs as illustrated may deploy/expand radially simultaneously so as to release the wafer, such that the wafer is in a released condition.

Thereby, based on above illustrations, the wafer locking mechanism 10 according to embodiments of the disclosure utilities a design thereof in which the elastic force as applied by the compression springs is used to push the plurality of rods 12 such that respective ends of the plurality of rods are thus pushed against the surface of the wafer base 11 in the form of a frustum shape, and several group of the jaws 14 (typically, e.g., four jaws arranged as two pairs) located on the plurality of rods 12 are in turn controlled to conduct opening or closing (i.e., retracting or expanding) motion, such that the wafer locking mechanism 10 is switched between the clamped condition where the jaws 14 are in tight contact with the periphery of the wafer and the released condition where the jaws 14 are in loose contact or even out of contact with the periphery of the wafer for the wafer, facilitating locking and releasing actions on the wafer for positioning the wafer.

In an exemplary embodiment, each jaw 14 for example comprises both an upper part and a lower part, and the upper part has a small lateral dimension as compared with that of the lower part, so as to support the wafer from below more effectively by placing a lower surface of the wafer at a junction between the upper part and the lower part of each jaw when the jaw clamps the periphery of the wafer.

In an embodiment of the disclosure, by way of example, the wafer base 11 is shaped to have a longitudinal section whose contour at side surface of the wafer base is a curve along which the plurality of rods conduct respective expected motions, as a function of an elevating or descending movement of the wafer base 11. Therefore, respective expected motions of the plurality of rods 12 may be designed in advance, such that, as the wafer base 11 is lowered or elevated, radial retraction or radial deploy/expansion of jaws 14 fixed on the rods 12 may be at a constant speed or becomes a variable-speed motion as desired, for example, when it is required to accelerate or decelerate suddenly during a certain stroke of a section of the rods 12. By way of example, at a transition section in the contour of the wafer base 11 from truncated cone shape of the upper portion thereof to cylindrical shape of the lower portion thereof, the contour there is designed to change relatively gently and smoothly, such that, for example, a deploy/expansion action, which is slowed down and controllable, of each jaw 14 may be implemented at an end of a period of deploy/expansion of each jaw 14, facilitating a control on releasing between each jaw 14 and the periphery of the wafer, e.g., so as to obtain a certain gap therebetween.

Moreover, as illustrated in FIG. 1 and FIG. 2, by way of example, one rod in each pair of rods in the plurality of rods 12 is provided with an adjusting threaded member 15, which is located at a respective distal end of the one rod and is screwable to push radially against a respective compression spring 13 of the plurality of compression springs 13. The adjusting threaded member 15 is configured to adjust pre-tensioning force of the respective compression spring 13, thereby adjusting the clamping force applied onto the wafer so as to ensure a secured and reliable positioning of the wafer. By way of example, as illustrated, each adjusting screw member 15 is in a form of an adjusting screw.

Accordingly, as illustrated in FIG. 1 and FIG. 2, for example, the other rod of each pair of rods in the plurality of rods 12 is provided with a locking threaded member 16, which is located at a respective distal end of the other rod and is screwable to be locked. Once an adjustment is completed by aforementioned adjusting threaded member 15, since respective ball-head portions 121 of the plurality of rods 12 contact and abut against the side surface of the wafer base 11 in the form of frustum shape, then each pair of rods 12 aligned in a same radial direction may abut against the wafer base 11 radially oppositely. Thereby, the locking threaded member 16 located on the other rod of said pair of rods 12 locks on the same pair of rods 12, accordingly, positions of a respective pair of jaws 14 on the same pair or rods 12 are also locked. In other words, once a positional adjustment is completed by the adjusting threaded member 15, the locking threaded member 16 is utilized to press against the adjusting threaded member 15 from an opposite side in the radial direction, preventing any loosening from occurring after long-term use.

Thereby, the plurality of rods 12 arranged in pairs as illustrated are locked simultaneously, resulting in that respective positions of the plurality of jaws 14 are also locked, such that the wafer may be clamped and positioned properly by radially retracting all the jaws 14 (e.g., four jaws 14 arranged as two pairs, as illustrated) simultaneously, then the wafer is in a locked state. By way of example, as illustrated, each locking threaded member 16 is in a form of a locking screw-stud.

As to two rods 12 diametrically aligned in each pair as above, at a distal end of one rod 12 there is provided with a respective adjusting threaded member 15, and at a distal end of the other rod 12 there is provided with a respective locking threaded member 16, respectively, then merely by adjustment on pushing action applied on a respective compression spring 13 of one of the two rods, pushing action on both rods 12 can be adjusted accordingly; in other words, at the distal end of the other rod 12, there is no need to adjust screwing in a threaded manner there, and it is merely required to tightly lock on the locking threaded member 16 there so as to prevent loosening, simplifying an adjustment operation of the rods 12.

In addition, in an embodiment of the present disclosure, the wafer locking mechanism 10 further comprises a rod base 17 formed with an axial channel through which the wafer base 11 is elevatable and a plurality of radial channels through which the plurality of rods 12 are extendable, such that the wafer base 11 is at least partially accommodated in the rod base 17, and the plurality of rods 12 are accommodated in the plurality of radial channels. Therefore, a restriction on degree of freedom of motions of both the wafer base 11 and the plurality of rods 12 may be implemented, such that the wafer base 11 is merely capable of performing a lifting/elevating or descending motion (which may be embodied as a sliding motion of the wafer base 11 inside the axial channel), and the plurality of rods 12 are merely capable of performing radially inward movements or radially outward movements (which may be embodied as respective sliding motions of the plurality of rods 12 within the plurality of radial channels, respectively), thus avoiding any undesired sliding displacement(s) of respective ball-head portions 121 of the plurality of rods 12 on the surface of the wafer base 11 (which displacement(s) may result from disengagement of any rod of the plurality of rods 12 from its radial alignment with respective other rod in the same pair of rods 12 due to lateral swinging or sliding thereof during movement) and in turn avoiding a failure in positioning the wafer by the jaws 14 caused thereby, effectively ensuring that the plurality of rods 12 keeps in a tight contact as expected with the wafer base 11.

Figure 4:
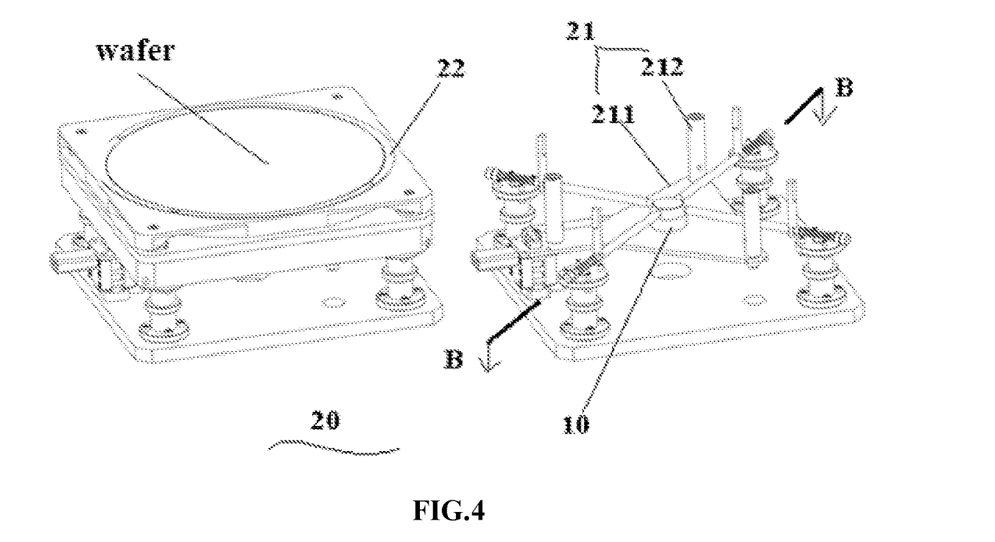
FIG. 4 schematically shows an exploded view of a wafer positioning device, according to embodiments of the present disclosure.
Figure 5:
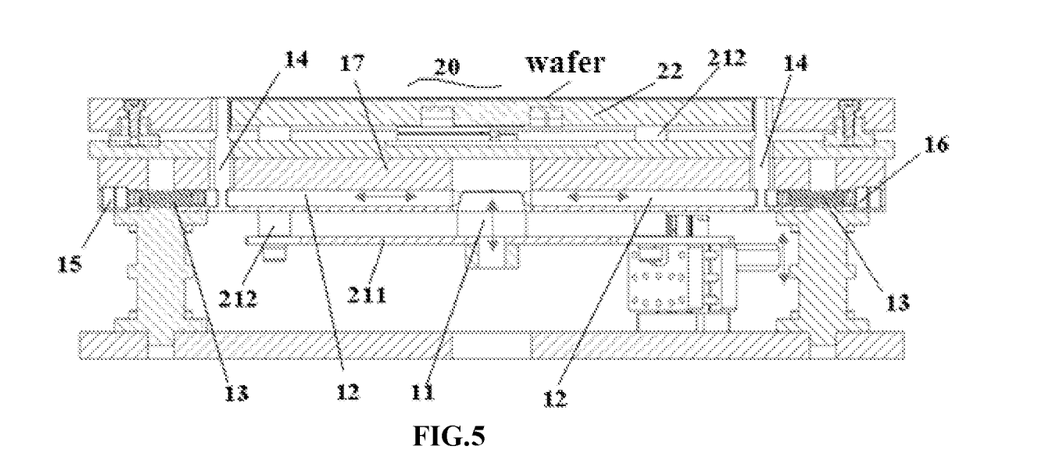
FIG. 5 shows a sectional view of the wafer positioning device taken along a B-B line as shown in FIG. 4.

FIG. 4 schematically shows an exploded view of a wafer positioning device, according to embodiments of the present disclosure; and FIG. 5 shows a sectional view of the wafer positioning device taken along a B-B line as shown in FIG. 4.

In another aspect of embodiments of the present disclosure, as illustrated in FIG. 4 and FIG. 5, a wafer positioning device 20 is proposed, comprising: the wafer locking mechanism 10 as mentioned above; and a wafer support 21; as well as an electrostatic chuck 22, which is mounted above the wafer base 11 and circumscribed among the plurality of jaws 14, and is configured to hold the wafer by electrostatic adsorption applied thereby. The wafer support 21 comprises: a base plate 211 which is vertically movable, with a base portion of the wafer base 11 being fixed thereto; and a plurality of pillars 212 extending from the base plate 211 in the same direction as a direction in which the plurality of jaws 14 extend.

By way of example, the electrostatic chuck 22 is typically mounted on the rod base 17, and is in a form of a disc shape which is co-axially arranged with respect to the wafer base 11. Typically, the electrostatic chuck 22 has a diameter which is for example smaller than a minimal distance between a pair of jaws 14 respectively located on each pair of rods 12. As such, even if the pair of jaws 14 are radially retracted inwards until they are closest to each other (for example, at that time, ball-head portions 121 of respective rods 12 contact and abut against the cylindrical lower portion of the wafer base 11, such that the pair of jaws may not continue to travel radially inwards), the electrostatic chuck 22 still remains within the range thereof defined by the plurality of jaws 14, and when the plurality of pillars 212 of the wafer support 21 which support the wafer are capable of bring the wafer in contact with the electrostatic chuck 22, an electrostatic adsorption may be implemented.

With such an arrangement, with the aid of aforementioned wafer locking mechanism 10, an error in positioning the wafer which occurs when the wafer is placed onto the electrostatic chuck 22 may be overcome, and thus a failure in automatic image calibration process resulting therefrom may in turn be avoided. Once the wafer locking mechanism 10 locks on the periphery of the wafer, then the electrostatic chuck 22 keeps the wafer in an adsorbed state through the electrostatic adsorption as above for subsequent detection and/or processing.

In an embodiment of the present disclosure, as illustrated in FIG. 4, the base plate 211 is for example in a form of a triangle shape, and the plurality of pillars 212 comprise three pillars 212 located at three vertices of the triangle shape, respectively. As such, a three-point support for (e.g.,) a lower surface of the wafer may be achieved in a simplest form.

Moreover, by way of example, the baseplate 211 is driven to elevate or descend by a motor, or a piezoelectric driving device formed by piezoelectric material. Thereby, the wafer support 21 is lowered down once being driven, and thus lowers the wafer base 11 and in turn bring the jaws 14 to lock the wafer and then get the pillars 212 out of contact with the wafer, such that the periphery of the wafer is tightly locked by the jaws 14 and is placed onto the electrostatic chuck 22 to ensure a contact between the lower surface of the wafer and the electrostatic chuck 22 (and then the wafer is held and retained by the electrostatic adsorption as applied by the electrostatic chuck 22); or alternatively, the wafer support 21 is driven to be elevated, and thus raise/lift the wafer base 11 and in turn bring the jaws 14 to release the wafer, and at the same time, the pillars 212 lift the wafer from the electrostatic chuck 22 so as to retrieve, i.e., take out the wafer from the electrostatic chuck 22.

Thereby, with a most simplified structure, with the aid of the wafer support 21, the wafer locking mechanism 10 is driven thereby, such that the wafer is placed onto the electrostatic chuck 22 for electrostatic adsorption, or alternatively the wafer is taken out of the electrostatic chuck 22, thus facilitating an accurate positioning of the wafer.

In an embodiment of the present disclosure, by way of example, each of the plurality of pillars 212 has a respective free end formed by hard rubber.

However, in such an exemplary embodiment, it is difficult to avoid any friction between the wafer and component(s) carrying such wafer. Therefore, it is relatively easy to generate static electricity on the wafer, especially at a moment when the component(s) carrying the wafer (such as the jaws 14 of the wafer locking mechanism) is/are separated from the wafer. Moreover, once the wafer is released from the electrostatic chuck, there may still be some residual static electricity. Furthermore, since respective areas of the free ends of the plurality of pillars 212 formed by hard rubber may be relatively small and relatively hard in material property, its locations in contact with the wafer may be readily subject to tip discharge (or so-called "point discharge"), which may result in electrostatic breakdown, such that electrically conductive layer (such as metallic layer or ITO (Indium Tin Oxide) layer) of internal wirings of the wafer may be burnt down accordingly.

FIGS. 6A~6E schematically illustrate a partial sectional view in proximity of a tip of a pillar of the wafer positioning device.

Figure 6A:
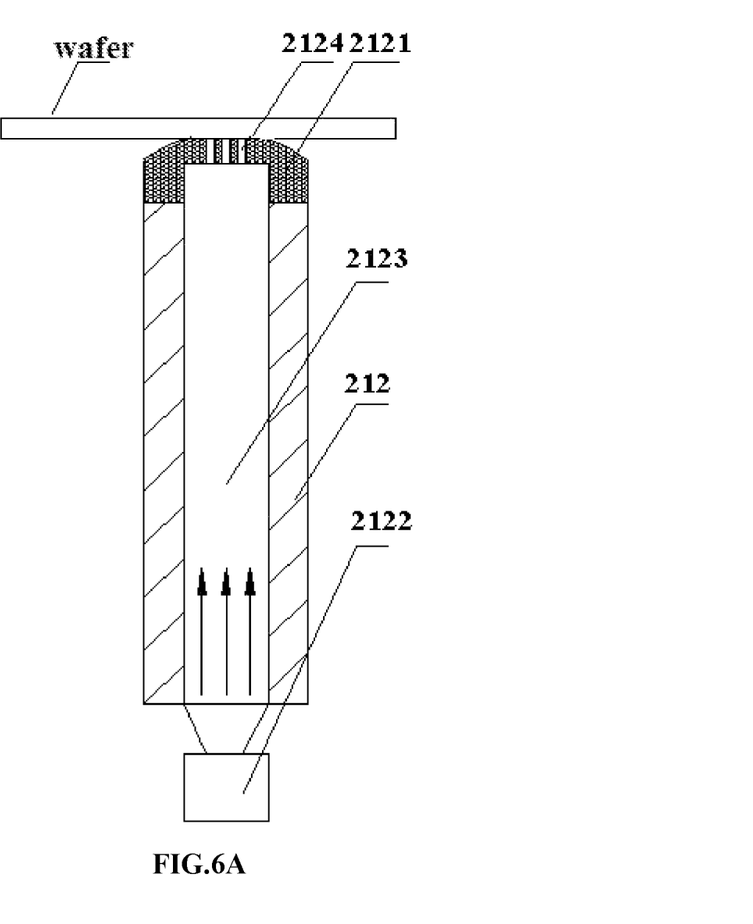
FIG. 6A to FIG. 6E schematically show a partial sectional view in proximity of a tip of a pillar of the wafer positioning device.

In an embodiment of the present disclosure, for example, as illustrated in FIG. 6A, the wafer positioning device 20 further comprises an ionic wind supply 2122; and each of the plurality of pillars 212 is further provided with: a support portion 2121 which is located at a free end of such pillar 212 and is to be in contact with the wafer to be detected, by means of an upper surface of the support portion when the wafer positioning device carries the wafer, with the free end functioning as a support end; a channel 2123 which is provided through the support portion 2121, the channel 2123 being configured to deliver an ionic wind which is delivered by the ionic wind supply 2122 into a respective pillar 212; and a plurality of delivery holes 2124, i.e., a plurality of first vent holes 2124, which are located on an upper surface of the support portion and are in communication with the channel 2123, with the ionic wind being delivered therethrough and in turn blown towards the wafer.

The ionic wind transmitted by the ionic wind supply 2122 and delivered inwards the channel 2123 of each of the plurality of pillars 212 are further blown through the through-holes formed in the support portion 2121 of each of the plurality of pillars, towards the wafer. Since the ionic wind carries a large number of positive and negative ions in respective free state, then, when it blows towards the wafer, the positive and negative ions in the free state may be actively combined with electrons on the wafer, so as to neutralize the static electricity on the wafer, mitigating or eliminating electrostatic breakdown phenomenon which may easily occur on the wafer when the wafer is separated from the component(s) carrying the wafer.

Figure 6B:
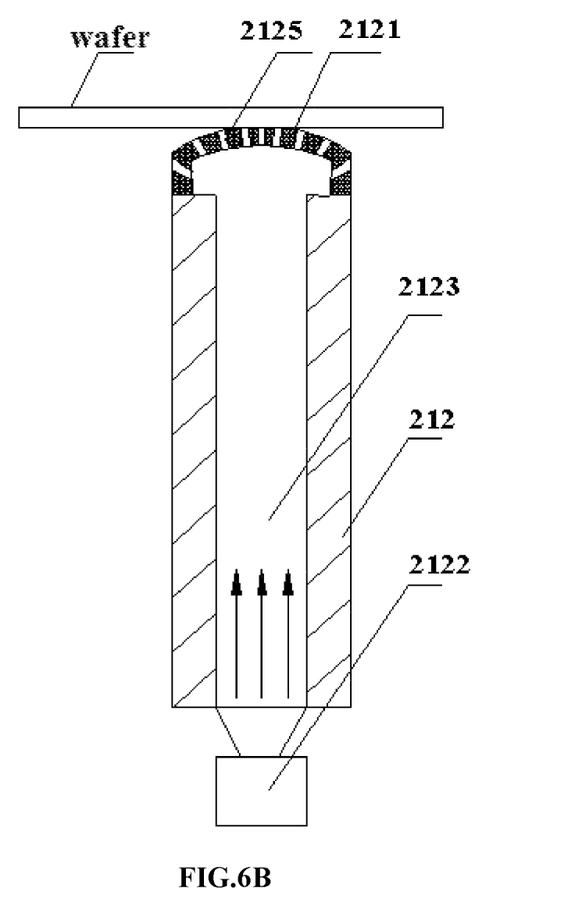

In an embodiment of the present disclosure, for example, as illustrated in FIG. 6B, the support portion 2121 is constructed to be a hollow structure defined collectively by both the upper surface and a sidewall of the support portion 2121, and the sidewall is additionally provided with a plurality of side delivery holes 2125, i.e., a plurality of second vent holes, in communication with the channel 2123.

Since the sidewall of the support portion 2121 is not in contact with the lower surface of the wafer, then, it is possible to continue to delivery ionic wind towards the wafer once the upper surface of the support portion 2121 gets in contact with the lower surface of the wafer, such that during a whole elevating or descending process of the pillars 212, the support portion 2121 always blows the ionic wind towards the lower surface of the wafer so as to continuously remove the static electricity from the wafer, thus lowering a possibility of electrostatic breakdown at the moment when the wafer is separated from the component(s) carrying the wafer.

Figure 6C:
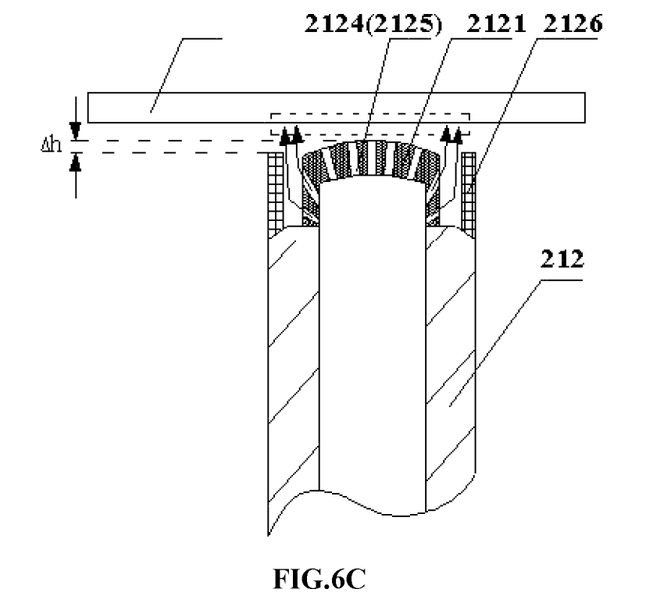

Additionally or alternatively, in an embodiment of the disclosure, by way of example, as illustrated in FIG. 6C, each of the plurality of pillars 212 is further provided with a flow-guiding shield 2126 which is disposed around a periphery of the support portion 2121 with a gap between the flow-guiding shield 2126 and the support portion 2121.

The flow-guiding shield 2126 is disposed around the periphery of the support portion 2121 and there is the gap between the flow-guiding shield 2126 and the support portion 2121 for gas passing therethrough. As such, the ionic wind which is blown out of the plurality of side delivery holes 2125 formed on the sidewall of the support portion 2121, in directions indicated by arrows as illustrated, may be guided along an inner wall of the flow-guiding shield 2126 to the wafer under blocking and guiding action applied by the flow-guiding shield 2126, such that an air flow loss, in other directions, of the ionic wind blown out of the plurality of side delivery holes 2125 of the sidewall of the support portion 2121 may be reduced.

Figure 6D:
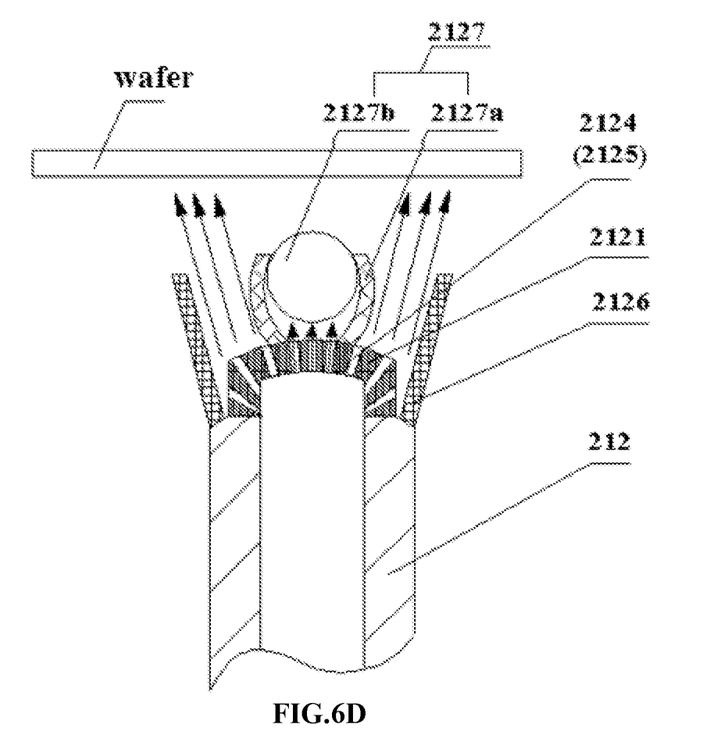

In an embodiment of the present disclosure, for example as illustrated in FIG. 6D, each of the plurality of pillars 212 is further provided with an auxiliary support portion 2127 which is additionally provided on the support portion 2121 and comprises a dome cover 2127a provided on the upper surface of the support portion 2121 and a floating ball 2127b provided within the dome cover 2127a, and the dome cover 2127a is further provided at a top end thereof with an opening, a diameter of which is smaller than that of the floating ball 2127b, such that the floating ball 2127b is capable of floating inside the dome cover 2127a and floating up until it is rotatably stuck at the opening. Thereby, on one hand, the ionic wind continuously neutralizes the static electricity on the wafer; on the other hand, with a change in the position of the floating ball 2127b inside the dome cover 2127a for example during a continuous downward movement of the floating ball resulting from that the wafer is being pressed downwards, then, with an action of buoyance applied upwards on the floating ball 2127b by a gas flow of the ionic wind, then a buffering phase may be provided, during which there is no immediate hard contact between the upper surface of the support portion 2121 and the wafer, i.e., no contact force exists therebetween, thus avoiding possible scratch of the wafer, since the floating ball 2127b (rather than the upper surface of the respective pillar 212) is continuously in direct contact with the lower surface of the wafer.

By way of example, there is a height difference $\Delta h$ between a top end of the flow-guiding shield 2126 and a top end of the support portion 2121 (or between top end of the flow-guiding shield 2126 and a top end of the dome cover 2127a of the auxiliary support portion 2127 in case that there additionally exists the auxiliary support portion), for example such that the top end of the flow-guiding shield 2126 is relatively low. Thereby, when the upper surface of the support portion 2121 is in contact with and supports the wafer, the flow-guiding shield 2126 is not in contact with the wafer, avoiding any scratch of surfaces of the wafer.

Figure 6E:
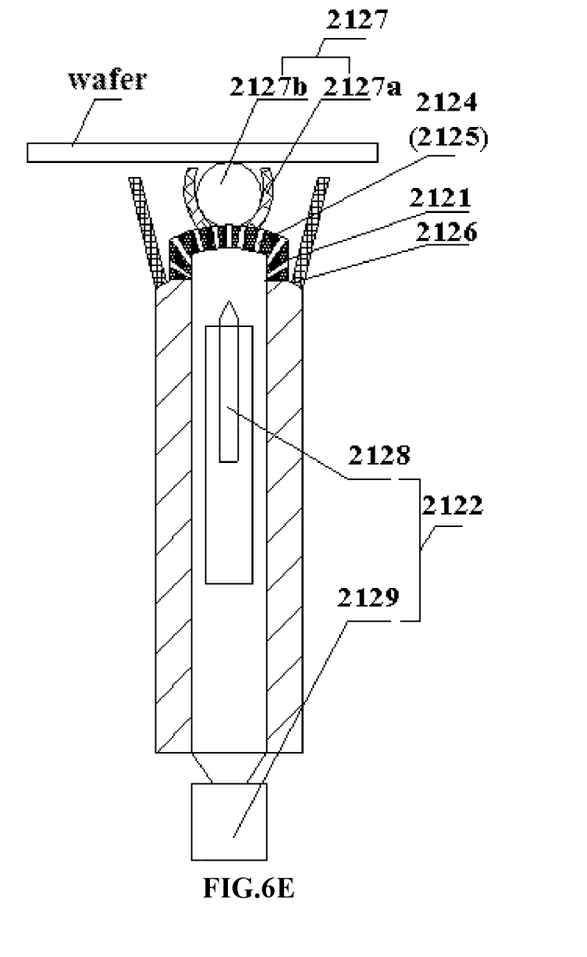

In an embodiment of the present disclosure, for example, as illustrated in FIG. 6E, the ionic wind supply 2122 comprises: an ion source 2128 in communication with the channel 2123 of each of the plurality of pillars; and a ventilation device 2129 provided at an entrance of the channel 2123 of each of the plurality of pillars. As such, the positive and negative ions generated in the ion source 2128 are carried along by the gas flow, which is generated by the ventilation device 2129 and flows through the channel 2123, and then blown towards the wafer so as to neutralize static electricity (i.e., electrostatic charges) on the wafer.

More specifically, by way of example, the ion source 2128 is provided adjacent to the free end, within the channel 2123 of each of the plurality of pillars, and the ion source 2128 is a metallic discharge needle for example arranged in an insulating housing with merely a discharging tip of the metallic discharge needle being exposed therefrom, so as to be electrically isolated from respective pillar 212 formed by metallic material. As such, once the metallic discharge needle connects with an external power supply, the tip may discharge to release positive and negative ions.

The wafer positioning device 20 comprises aforementioned wafer locking mechanism 10, and accordingly has specific construction and corresponding technical effect similar to those of the latter, which will not be repeated discussed here.

Figure 7:
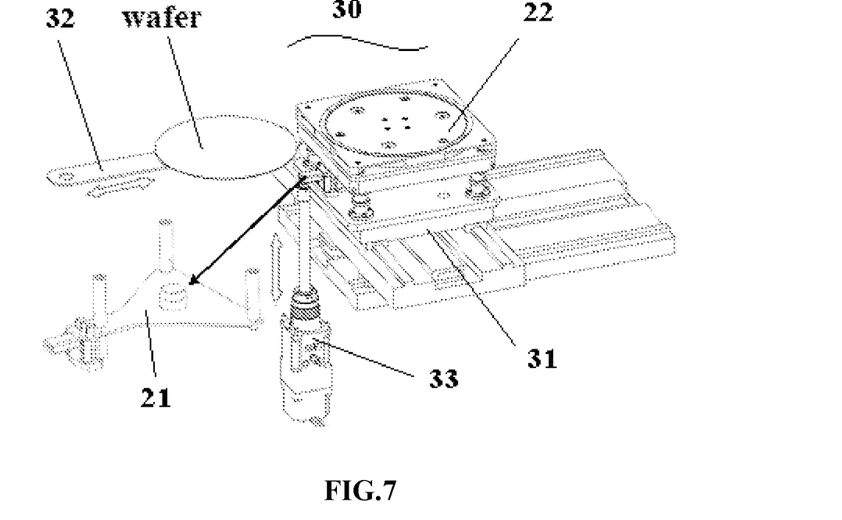
FIG. 7 shows a structural schematic view of a wafer conveying device, according to embodiments of the present disclosure.

FIG. 7 shows a structural schematic view of a wafer conveying device, according to embodiments of the present disclosure.

In another aspect of the embodiments of the present disclosure, as illustrated in FIG. 7, a wafer conveying apparatus 30 is proposed, comprising: the wafer positioning device 20 as above; a two-dimensional workbench 31, which carries the wafer positioning device 20 and is configured to perform a planar two-dimensional movement to move the wafer positioning device 20 to a wafer exchange position where the wafer is to be loaded or removed; and a robot arm 32, which is arranged alongside the wafer positioning device 20 and configured to move the wafer to a position above and concentric with the electrostatic chuck 22.

By way of example, the wafer conveying apparatus 30 further comprises a driving mechanism 33, for example, a linear motor or a piezoelectric actuator, which is attached to the wafer support 21 for driving the wafer support 21 to perform an elevating or descending motion.

The wafer conveying apparatus 30 comprises the wafer locking mechanism 10 and the wafer positioning device 20, and accordingly has specific construction and corresponding technical effect similar to those of the wafer locking mechanism 10 and the wafer positioning device 20, which will not be repeated discussed here.

Figure 8:
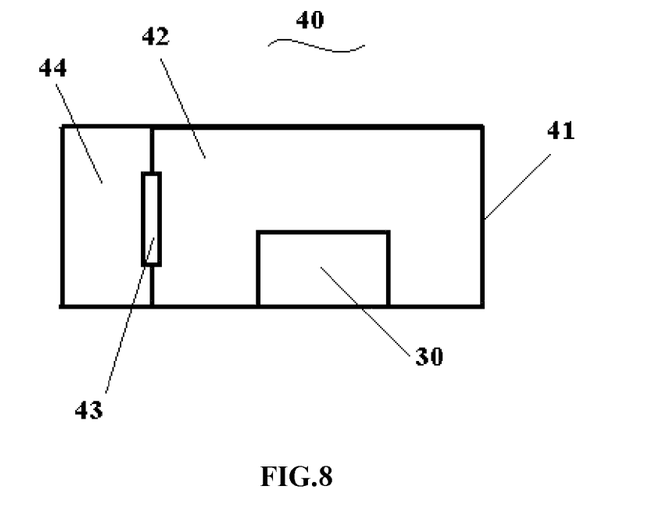
FIG. 8 shows a structural schematic view of a vacuum chamber device configured to transfer a wafer between different pressure environments, according to embodiments of the present disclosure.

FIG. 8 shows a structural schematic view of a vacuum chamber device configured to transfer a wafer between different pressure environments, according to embodiments of the present disclosure.

In another aspect of embodiments of the present disclosure, as illustrated in FIG. 8, a vacuum chamber device 40 configured to transfer a wafer between different pressure environments is proposed. The vacuum chamber device 40 comprises: a housing 41, which defines a vacuum chamber 42 therein as a first pressure environment; the wafer conveying device as above, which is provided inside the vacuum chamber 42; and a valve 43, which is provided on a side of the housing 41 and is configured to switch between a communication state where the vacuum chamber 42 and the second pressure environment 44 different from the first pressure environment are in communication with each other once the valve is opened therebetween, and a disconnected state where the vacuum chamber 42 and the second pressure environment 44 are disconnected with each other once the valve is closed therebetween, such that the second pressure environment 44 is at substantially the same pressure as the vacuum chamber 42 in response to the communication state, or the vacuum chamber 42 maintains its predefined vacuum condition in response to the disconnected state. The robot arm 32 is configured to transfer the wafer between the second pressure environment 44 and the vacuum chamber 42.

The vacuum chamber device 40 comprises the wafer locking mechanism 10, the wafer positioning device 20 and the wafer conveying apparatus 30, and accordingly has specific construction and corresponding technical effect similar to those of the wafer locking mechanism 10, the wafer positioning device 20 and the wafer conveying apparatus 30, which will not be repeated here.

Figure 9:
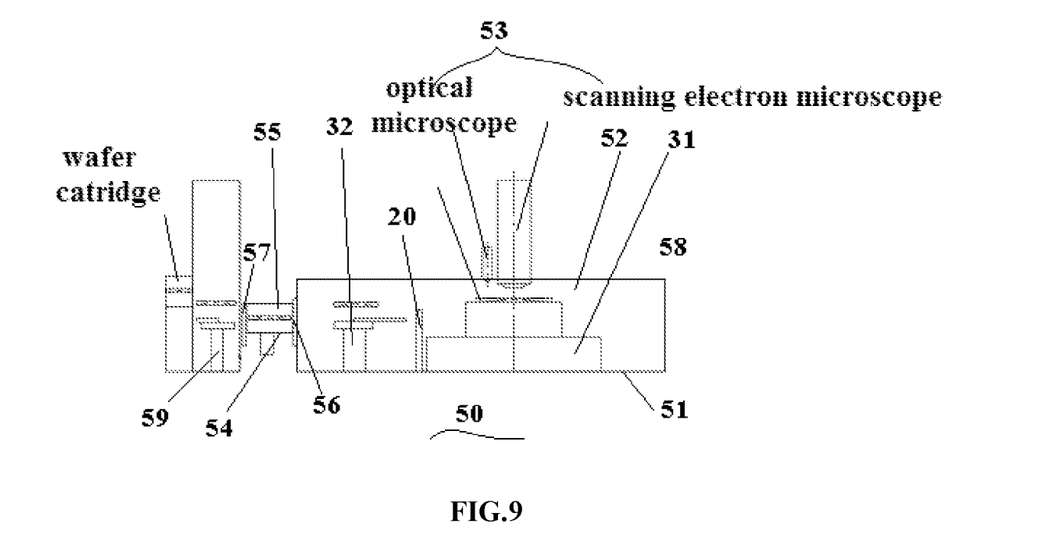
FIG. 9 shows a structural schematic view of an electron beam detection apparatus, according to embodiments of the present disclosure.

FIG. 9 shows a structural schematic view of an electron beam detection apparatus, according to embodiments of the present disclosure.

In yet another aspect of the embodiment of the present disclosure, as illustrated in FIG. 9, an electron beam detection apparatus 50 is proposed, comprising: a first housing 51, which defines a vacuum chamber 52 therein, with both an electron beam detection device 53 and the wafer conveying device as above being mounted in the vacuum chamber 52, and the electron beam detection device 53 comprising a scanning electron microscope;

a second housing 54, which is provided adjacent to the first housing 51 and defines a transition chamber 55 therein, the transition chamber 55 communicating at one side thereof with the vacuum chamber 52 via a first valve 56 and communicating at the other side thereof with an atmosphere environment 58 via a second valve 57. The robot arm 32 is configured to move the wafer from the transition chamber 55 into the vacuum chamber 52; and the electron beam detection device 50 further comprises a second robot arm 59 which is provided outside the first housing 51 and configured to move the wafer from the atmospheric environment 58 into the transition chamber 55.

The electron beam detection apparatus 50 comprises the wafer locking mechanism 10, the wafer positioning device 20 and the wafer conveying apparatus 30, and accordingly has specific construction and corresponding technical effect similar to those of the wafer locking mechanism 10, the wafer positioning device 20 and the wafer conveying apparatus 30, which will not be repeated here.

As such, the embodiments of the present disclosure have following superior technical effects:

In the embodiments of the present disclosure, there is proposed a wafer locking mechanism configured to lock a wafer, the wafer locking mechanism comprising: a wafer base, constructed in a form of a frustum shape tapering from a bottom portion thereof towards a top portion thereof, and configured to be elevatable along a direction of an axis thereof; a plurality of rods, which are diametrically aligned in pairs perpendicular to the axis; and a plurality of compression springs, which are respectively sheathed on respective distal ends of the plurality of rods distal to the wafer base, in one-to-one correspondence and extend radially outwards. The plurality of rods are respectively provided with both a plurality of ball-head portions which are located at respective proximal ends thereof proximate to the wafer base and abut against the wafer base, in one-to-one correspondence, and a plurality of jaws which protrude from the respective distal ends along a direction of the axis on a single side of the top portion and are pressed radially inwards by the plurality of compression springs, in one-to-one correspondence. Elastic forces of the compression springs may be adjusted by adjusting the threaded members, and the plurality of rods are pushed against the wafer base in the form of a frustum shape under an action of elastic forces of the compression springs, facilitating improving reliability in positioning the wafer. Moreover, when the wafer base rises and falls, the wafer may be released or clamped as the jaws on the rods are expanded/deployed or retracted with the radial movement of the rods, facilitating obtaining a relatively high precision in positioning the wafer, with a simple follow-up between simplified structure and components.

In addition, according to aforementioned embodiments of the present disclosure, it can be understood that any technical solution formed by any combination of two or more embodiments also falls within the scope of protection of the present disclosure.

It should be understood that, orientation terms in the description of the present disclosure, such as "up", "down", "left", "right", and the like, are used to interpret orientation relationship as illustrated in the attached drawings. These orientation terms should not be interpreted as limitation of the scope of protection of the present disclosure.

The embodiments of the present disclosure are described in a progressive manner. Each embodiment focuses on the differences thereof as compared with other embodiments, and same or similar parts of various embodiments can be referred to each other.

The above are merely preferred embodiments of the invention and are not intended to limit the disclosure. Any modification, equivalent replacement, improvement, and the like made within the spirit and principles of the invention shall be contained in the protection scope of disclosure.

What is claimed is:

1. A wafer locking mechanism configured to lock a wafer, the wafer locking mechanism comprising:

a wafer base, constructed in a form of a frustum shape tapering from a bottom portion thereof towards a top portion thereof, and configured to be elevatable along a direction of an axis thereof;

a plurality of rods, which are diametrically aligned in pairs perpendicular to the axis; and a plurality of compression springs, which are respectively sheathed on respective distal ends of the plurality of rods distal to the wafer base, in one-to-one correspondence and extend radially outwards, wherein the plurality of rods are respectively provided with both a plurality of ball-head portions which are located at respective proximal ends thereof proximate to the wafer base and abut against the wafer base, in one-to-one correspondence, and a plurality of jaws which protrude from the respective distal ends along a direction of the axis on a single side of the top portion and are pressed radially inwards by the plurality of compression springs, in one-to-one correspondence;

wherein one rod in each pair of rods in the plurality of rods is provided with an adjusting threaded member, which is located at a respective distal end of the one rod and is screwable to push radially against a respective one of the plurality of compression springs.

2. The wafer locking mechanism according to claim 1, wherein each adjusting screw member is in a form of an adjusting screw.

3. The wafer locking mechanism according to claim 1, wherein the other rod of each pair of rods in the plurality of rods is provided with a locking threaded member, which is located at a respective distal end of the other rod and is screwable to be locked.

4. The wafer locking mechanism according to claim 3, wherein each locking threaded member is in a form of a locking screw-stud.

5. The wafer locking mechanism according to claim 1, wherein the plurality of rods comprises an even number of pairs of rods.

6. The wafer locking mechanism according to claim 5, wherein the even number of pairs of rods comprises two pairs of rods arranged at uniform angular interval in a circumferential direction perpendicular to the axis.

7. The wafer locking mechanism according to claim 1, wherein the wafer base is shaped to have a contour which is a truncated cone on an upper portion thereof and a cylindrical shape on a lower portion thereof.

8. The wafer locking mechanism according to claim 1, wherein the wafer base is shaped to have a longitudinal section whose contour at a side surface of the wafer base is a curve along which each of the plurality of rods conducts an expected motion thereof, as a function of an elevating or descending movement of the wafer base.

9. The wafer locking mechanism according to claim 1, wherein the plurality of rods are formed with respective holes extending in the direction of the axis, and the plurality of jaws at least partially pass through and are fixed in respective one of the holes of the respective rods in the plurality of rods, in one-to-one correspondence.

10. The wafer locking mechanism according to claim 1, wherein the wafer locking mechanism further comprises a rod base formed with an axial channel through which the wafer base is elevatable and a plurality of radial channels through which the plurality of rods are extendable.

11. A wafer positioning device, comprising:

the wafer locking mechanism according to claim 1; and a wafer support, comprising:

a base plate which is vertically movable, with a base portion of the wafer base being fixed thereto; and a plurality of pillars extending from the base plate in the same direction as a direction in which the plurality of jaws extend, and an electrostatic chuck, which is mounted above the wafer base and circumscribed among the plurality of jaws, and is configured to hold the wafer by electrostatic adsorption applied thereby.

12. The wafer positioning device according to claim 11, wherein the base plate is in a form of a triangle shape, and the plurality of pillars comprise three pillars located at three vertices of the triangle shape, respectively.

13. The wafer positioning device according to claim 11, wherein each of the plurality of pillars has a respective free end formed by hard rubber.

14. The wafer positioning device according to claim 11, wherein the wafer positioning device further comprises an ionic wind supply, and wherein each of the plurality of pillars is further provided with:

a support portion which is provided at a free end thereof and is to be in contact with the wafer to be detected, by means of an upper surface of the support portion when the wafer positioning device carries the wafer;

a channel which is provided therethrough and configured to deliver an ionic wind outputted from the ionic wind supply into the respective one of the plurality of pillars; and a plurality of first vent holes which are located on the upper surface of the support portion and are in communication with the channel, with the ionic wind being delivered therethrough and in turn blown towards the wafer.

15. The wafer positioning device according to claim 14, wherein the support portion is constructed to be a hollow structure defined collectively by both the upper surface and a sidewall of the support portion, and the side wall is additionally provided with a plurality of second vent holes in communication with the channel.

16. The wafer positioning device according to claim 15, wherein each of the plurality of pillars is further provided with an auxiliary support portion which is additionally provided on the support portion and comprises a dome cover provided on the upper surface of the support portion and a floating ball provided within the dome cover, and the dome cover is further provided at a top end thereof with an opening, a diameter of which is smaller than that of the floating ball.

17. The wafer positioning device according to claim 14, wherein each of the plurality of pillars is further provided with a flow-guiding shield which is disposed around a periphery of the support portion with a gap between the flow-guiding shield and the support portion.

18. The wafer positioning device according to claim 14, wherein the ionic wind supply comprises:

an ion source in communication with the channel of each of the plurality of pillars; and a ventilation device provided at an entrance of the channel of each of the plurality of pillars.

19. The wafer positioning device according to claim 18, wherein the ion source is provided adjacent to the free end, within the channel of each of the plurality of pillars, and wherein the ion source is a metallic discharge needle.

20. The wafer positioning device according to claim 11, wherein the base plate is driven to elevate or descend by a motor, or a piezoelectric driving device formed by piezoelectric material.

21. A wafer conveying apparatus comprises:
the wafer positioning device according to claim 11;
a two-dimensional workbench, which carries the wafer positioning device and is configured to perform a planar two-dimensional movement to move the wafer positioning device to a wafer exchange position where the wafer is to be loaded or removed; and
a robot arm, which is arranged alongside the wafer positioning device and configured to move the wafer to a position above and concentric with the electrostatic chuck.

22. A vacuum chamber device configured to transfer a wafer between different pressure environments, comprising:
a housing, which defines a vacuum chamber therein as a first pressure environment;
the wafer conveying device according to claim 21, which is provided inside the vacuum chamber; and
a valve, which is provided on a side of the housing and is configured to switch between a communication state where the vacuum chamber and a second pressure environment different from the first pressure environment are in communication with each other once the valve is opened therebetween, and a disconnected state where the vacuum chamber and the second pressure environment are disconnected with each other once the valve is closed therebetween, such that the second pressure environment is at substantially the same pressure as the vacuum chamber in response to the communication state, or the vacuum chamber maintains its vacuum condition in response to the disconnected state,
wherein the robot arm is configured to transfer the wafer between the second pressure environment and the vacuum chamber.

23. An electron beam detection apparatus, comprising:
a first housing, which defines a vacuum chamber therein, with both an electron beam detection device and the wafer conveying device according to claim 21 being mounted in the vacuum chamber, and the electron beam detection device comprising a scanning electron microscope;
a second housing, which is provided adjacent to the first housing and defines a transition chamber therein, the transition chamber communicating at one side thereof with the vacuum chamber via a first valve and communicating at the other side thereof with an atmosphere environment via a second valve; and
wherein the robot arm is configured to move the wafer from the transition chamber into the vacuum chamber; and
wherein the electron beam detection apparatus further comprises a second robot arm which is provided outside the first housing and configured to move the wafer from the atmospheric environment into the transition chamber.

* * * * *